(12) United States Patent
Nozawa et al.

(10) Patent No.: US 6,723,477 B2
(45) Date of Patent: Apr. 20, 2004

(54) METHOD FOR MANUFACTURING PHASE SHIFT MASK BLANK AND METHOD FOR MANUFACTURING PHASE SHIFT MASK

(75) Inventors: Osamu Nozawa, Tokyo (JP); Masaru Mitsui, Yamanashi (JP); Hideaki Mitsui, Tokyo (JP)

(73) Assignee: Hoya Corporation, Tokyo (JP)

( * ) Notice: Subject to any disclaimer, the term of this patent is extended or adjusted under 35 U.S.C. 154(b) by 130 days.

(21) Appl. No.: 09/949,717

(22) Filed: Sep. 12, 2001

(65) Prior Publication Data

US 2002/0058186 A1 May 16, 2002

(30) Foreign Application Priority Data

Sep. 12, 2000 (JP) .................................. P.2000-277215
Aug. 10, 2001 (JP) .................................. P.2001-243317

(51) Int. Cl.[7] ................................................. G03F 9/00
(52) U.S. Cl. ........................................................ 430/5
(58) Field of Search ..................... 430/5, 322; 428/428; 716/19

(56) References Cited

U.S. PATENT DOCUMENTS 5,474,864 A    12/1995   Isao et al.
5,721,075 A  * 2/1998    Hashimoto et al. ............ 430/5
5,834,142 A  * 11/1998   Yabe et al. ...................... 430/5

FOREIGN PATENT DOCUMENTS

| JP | 6-332152  | 12/1994 |
| JP | 7-104457  | 4/1995  |
| JP | 7-140635  | 6/1995  |
| JP | 2966369   | 8/1999  |

OTHER PUBLICATIONS

Ohyo Buturi, Applied physics, vol. 60, No. 11 (1991), the Japan Society of Applied Physics, etc.

* cited by examiner

Primary Examiner—S. Rosasco
(74) Attorney, Agent, or Firm—Sughrue Mion, PLLC

(57) ABSTRACT

To provide a method for manufacturing a phase shift mask blank hating a light translucent film or a light translucent portion having the designated phase angle and transmittance and being superior in film characteristics of chemical resistance, light resistance, and internal stress.

The invention is characterized by having a translucent film on a transparent substrate, wherein thermal treatment of the translucent film is implemented at more than 150° C. after forming the translucent film comprising nitrogen, metal, and silicon as a main component on said transparent substrate.

18 Claims, 4 Drawing Sheets

LIGHT AMPLITUDE
DISTRIBUTION OF MASK

LIGHT STRENGTH
DISTRIBUTION OF
TRANSFERRED BODY

METHOD FOR MANUFACTURING PHASE SHIFT MASK BLANK AND METHOD FOR MANUFACTURING PHASE SHIFT MASK

BACKGROUND OF THE INVENTION

1. Field of the Invention

The present invention relates to a phase shift mask that improves resolution of a transcription pattern by applying a phase difference between exposure lights permeating a mask. The present invention also relates to a phase shift mask blank material. The present invention particularly relates to method for manufacturing a halftone type phase shift mask blank and method for manufacturing a halftone type phase shift mask.

2. Description of the Related Art

In recent years, high resolution and focal depth, which are two important characteristics required for photolithography, have opposed relation, and it is known that actual resolution can not be improved only by high NA (Numerical Aperture) of a lens of an exposure device and shortening of wavelength (*Semiconductor World December* 1990, and *Applied physics* Vol. 60, November 1991, the Japan Society of Applied Physics, etc.).

Under the circumstances, phase shift lithography is viewed as a photolithography technique of the next generation. The phase shift lithography is a method improving resolution of light lithography by change of only a mask without change of an optical system, and resolution is greatly improved using interference of mutual permeated light by applying phase difference between exposure light permeating a photo mask.

The phase shift mask is a mask having both light strength information and phase information, and various kinds, such as Levenson type, auxiliary pattern type, self matching type (edge emphasis type) and so on are known. This phase shift mask is complex in structure and requires technical expertise to produce, compared with the conventional photo mask having only light strength information.

As one of the phase shift masks, a so-called half tone type phase shift mask has been developed recently.

Since the half tone type phase shift mask has two functions, a shielding function so that a translucent portion virtually shields exposure light and a phase shift function so that a translucent portion shifts phase of light (usually reverse), it is needless to form a shielding film pattern and a phase shift film pattern individually so that the construction is simple and production is easy.

As shown in FIG. 1, the half tone type phase shift mask is constructed of a light transparent portion (transparent substrate exposure portion) 200 permeating strong light substantially contributing to exposure and a translucent portion (a light shielding portion and a phase shifter portion) 300 transmitting weak light actually not contributing to exposure (See FIG. 1(*a*)). Phase of light permeating the light transparent portion is shifted so that phase of light permeating the translucent portion becomes actually reversed against phase of light permeating the transparent portion (See FIG. 1(*b*)). Light passing near the boundary portion of the light translucent portion and the light transparent portion, and getting in the other region by diffraction phenomenon cancel each other so that light strength at the boundary is made almost zero and, by contrast, resolution of the boundary is improved (See FIG. 1(*c*)).

The light translucent portion of the above-mentioned half tone type phase shift mask is needed to have the most suitable values required for both the light transmission factor and phase shift quantity.

The applicant of the application has previously investigated a phase shift mask for realizing the most suitable values required at a single layer light transparent portion (Japanese Patent Laid-Open No. 332152/1994).

The light translucent portion of the phase shift mask is constructed by a thin film consisting of metal, such as molybdenum and the like, silicon, and oxygen, as a main component. Concretely, these materials are, for example, material including oxygen, molybdenum, and silicon (called MoSiO family material), and material including oxygen, nitrogen, molybdenum, and silicon (called MoSiON family material).

According to the construction, transmittance can be controlled by selecting the oxygen content or the content of oxygen and nitrogen, and the phase shift quantity can be controlled by thickness of the film. By constructing the light translucent portion with such material, the light translucent portion is constructed with a single layer film consisting of one kind of material, and the film forming process is simplified and one etching medium can be used, as compared with construction of multi layers consisting of different materials, so as to simplify the manufacturing process.

The applicant of the application has previously investigated a phase shift mask having a light translucent portion with improved characteristics of acid resistance, light resistance, conductivity, and so on (Japan Patent No. 2966369).

The light translucent portion of the phase shift mask is constructed by a thin film including material consisting of metal such as molybdenum and the like, silicon, and nitrogen as a main component. Concretely, this material includes nitrogen, molybdenum, and silicon (called MoSiN family material).

However, the following problems result in the above-mentioned conventional MoSiN family half tone type shift mask and the method for manufacturing the same.

That is, as described above, in designing the film material of the translucent portion of the phase shift mask, control of phase angle and transmittance is carried out by selecting contents components, and the transmittance is adjusted by setting contents of oxygen and/or nitrogen. However, because the transmittance must be adjusted only by nitrogen using MoSiN family material, fine adjusting of transmittance to obtain the desired transmittance is difficult. Then, although a method further adding oxygen is considered, rate of change of transmittance becomes large by adding oxygen, fine adjusting is difficult, and further chemical resistance and light resistance against exposure light are worse than only using nitrogen.

A requirement for chemical resistance (acid resistance and alkali resistance) to the washing liquid of the mask is severe as shortening wavelength of exposure wavelength so that higher chemical resistance is required.

Further, since fine working of a pattern is advanced recently, internal stress of the translucent film is increased. However, there is a problem that film of low internal stress in absolute value is not always obtained when the composition is adjusted to obtain the designated transmittance and phase angle.

SUMMARY OF THE INVENTION

The invention is carried out in view of the above-mentioned problems, and an object is to provide a method for manufacturing a phase shift mask blank or a method for manufacturing a phase shift mask having the designated phase angle and transmittance, and having a translucent film or a light translucent portion superior in chemical resistance, light resistance, and film characteristics such as internal stress.

To achieve the above-mentioned object, the invention has the following aspects.

An aspect of the invention is a method for manufacturing a half tone type phase shift mask blank having a translucent film on a transparent substrate, wherein thermal treatment of the translucent film is implemented at more than 150° C. after forming the translucent film including at least one layer of thin film comprising nitrogen, metal, and silicon as a main component on said transparent substrate.

Another aspect of the invention is a method for manufacturing a half tone type phase shift mask blank having a translucent film on a transparent substrate, wherein thermal treatment of the translucent film is implemented at more than 380° C. after forming the translucent film including at least one layer of thin film including oxygen and/or nitrogen, and silicon on said transparent substrate.

Yet another aspect of the present invention is a method for manufacturing a photo mask having thin film of one layer or multi layers for forming a pattern on a transparent substrate, wherein thermal treatment is implemented so that flatness change quantity at before and after film forming of thin film having said one layer or multi layers is less than 0.5 μm after forming thin film of one layer or multi layers including at least one layer of thin film having compression stress on said transparent substrate.

Further, another aspect of the present invention is a method for manufacturing a half tone type phase shift mask having a pattern of a light translucent film patterned on a transparent substrate, wherein thermal treatment of the pattern of the translucent film is implemented at more than 150° C. after forming the translucent film including.

DESCRIPTION OF THE PREFERRED EMBODIMENTS

Figure 1:
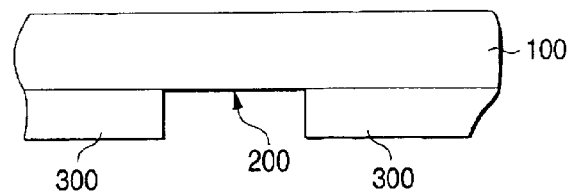
FIGS. 1(a), 1(b) and 1(c) are views for describing transfer principle of a half tone type phase shift mask.
Figure 1:
Figure 1:
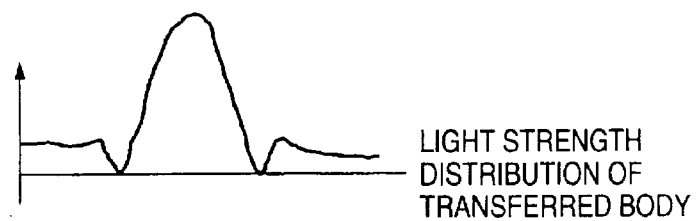

The method for manufacturing the phase shift mask blank of the invention achieves improvement of chemical resistance of the light translucent film, improvement of light resistance to exposure light, fine adjusting of transmittance, and decrease of internal stress by carrying out the thermal treatment of the light translucent film after forming the light translucent film including thin film consisting of nitrogen, metal, and silicon as a main component on the transparent substrate.

The invention will now be described in detail.

In a manufacturing method of the invention, a light translucent film or a light transparent portion of a half tone type phase shift mask blank or mask is constructed by thin film including at least one layer of thin film consisting of metal, silicon, and nitrogen as main components.

Although acid resistance improves and discharge is stable compared with the case where oxygen is included, it is not enough to construct the light translucent portion with a thin film not including oxygen.

After forming the above-mentioned light translucent film or the light translucent portion, thermal treatment is carried out at no less than 150° C. Temperature of the thermal treatment less than 150° C. is not effective for improvement of chemical resistance and reduction of internal stress. Temperature of the thermal treatment is desirably more than 200° C., further desirably 250° C., moreover desirably more than 300° C., still further desirably more than 350° C., and finally, preferably more than 380° C. That is, the higher the temperature is, the more the chemical resistance improves and internal stress is decreased, however, change quantity of transmittance increases. Therefore, it is desirable to set the temperature of thermal treatment responding to the change of transmittance. Giving priority to the improvement of chemical resistance and reduction effect of internal stress, the desired transmittance, the desired chemical resistance, and internal stress may be obtained by thermal treatment. For example, flatness changing quantity is improved at least 0.3 μm or more comparing with before thermal treatment at equal to or higher than 380° C. At equal to or more than 550° C., flatness changing quantity is improved more than 0.6 μm compared with before thermal treatment for the purpose of improving internal stress. When the temperature is too high, there is a problem that productivity becomes worse because rising time and falling time of the temperature becomes too long. Because of that, temperature of the thermal treatment is desirable less than or equal to 700° C. Time of thermal treatment is the time at which heat reaches the whole light translucent film, for example, more than one minute is enough.

It is desirable not to include reactive atmosphere such as oxygen in the atmosphere of the thermal treatment. The reason is that composition of direction of film thickness changes when reactive atmosphere is included. Therefore, a desirable atmosphere is inert gas such as nitrogen, argon, and the like.

The thermal treatment may be carried out after forming the light translucent film on the transparent substrate (state of blank), and may be carried out after patterning the light transmitting film on the transparent substrate (state of mask). However, high temperature thermal treatment of a fine pattern may possibly worsen the pattern shape. By carrying out at the blank state, there is an effect of depressing the change of film quality at the baking process (less than 200° C., for example, about 180° C.) after that. To obtain such an effect, thermal treatment at a high temperature is more desirable than baking temperature of a resist.

The translucent film includes one layer construction and multi-layer construction, designed so that phase angle and transmittance are made to the desired values by laminating two or more low transmittance layers and high transmittance layers. In the multi layer construction, reduced internal stress is obtained when at least one layer among the multi layers construction is a thin film including oxygen and/or nitrogen, and silicon, or a thin film having compressed stress.

In another method of the invention, the method achieves an improvement on the internal stress of a half tone type phase shift mask blank having light translucent film, including at least one layer of thin film including oxygen and/or nitrogen and silicon, or a photo mask blank for forming a pattern.

A thin film including oxygen and/or nitrogen and silicon, and in particular, a thin film virtually consisting of oxygen and/or nitrogen, metal, and silicon, that is, film having SiN, SiON, and SiO as a matrix, has a compression stress so as to appear clearly depending on the forming film condition. Because of that, improvement of internal stress is designed by carrying out thermal treatment at more than 380° C. that is actual level in effect of stress improvement.

The translucent film includes one layer construction and multi layer construction designed so that phase angle and transmittance are made to the desired value by laminating two or more low transmittance layers and high transmittance layers. In the multi layer construction, reduction effect of internal stress of the invention is obtained when at least one layer among the multi layer construction is a thin film including oxygen and/or nitrogen, and silicon, or a thin film having compressed stress.

A thin film to form a pattern includes light translucent film, etc., in a photo mask, for example, a shielding film (chrome, chromium compound including oxygen, nitrogen, carbon, etc. in chrome, another chromium compound, and the like) and a half tone type phase shift mask (material including oxygen and/or nitrogen in metal and silicon, chromium oxide, chromium fluoride, and so on). In such a photo mask, a photo mask suitable for fine pattern working can be obtained by making flatness changing quantity less than 0.5 $\mu$m, desirably less than 0.3 $\mu$m using thermal treatment after film forming process. That is, with fining of a semiconductor, shortening wavelength of a light source used for lithography and high NA of lens of an exposure device are advanced. High flatness of the photo mask is required to obtain focal depth because high NA of the lens of an exposure device and obtaining of focal depth are in opposed relation, and the photo mask according to the invention satisfies such a request. Here, flatness changing quantity is flatness changing quantity of a transparent substrate after thin film forming to a transparent substrate where thin film is not formed, and is defined with difference of height at the highest point and the lowest point from average face of the substrate within a range excluding the end portion of the substrate (for example, range of 3 mm). In this case, when the thin film has compression stress by selection of material or film forming method, decreasing internal stress can be obtained by thermal treatment.

About the half tone type shift mask having the light translucent film including at least one layer of thin film including oxygen and/or nitrogen, and silicon, by carrying out thermal treatment of the light translucent film with more than 380° C., flatness changing quantity can be improved more than 0.3 $\mu$m compared with before thermal treatment.

In the invention, for metal constructing the light translucent film or light translucent portion, molybdenum, zirconium, titanium, vanadium, niobium, tantalum, tungsten, nickel, and palladium can be mentioned.

Although metal used usually is molybdenum, molybdenum in the above-mentioned metals is particularly superior in the point of controllability of transmittance and in the point that it is large in target density at use of spattering target including metal and silicon and can lessen particles in the film. Titanium, vanadium, and niobium are a little worse than molybdenum in target density though being superior in durability to alkali solution. Tantalum is a little worse than molybdenum in controllability of transmittance though being superior in durability to alkali solution and target density. Tungsten is a little worse than molybdenum in discharge characteristic at spattering though having similar characteristic as molybdenum. It is a little hard to implement dry etching with nickel and palladium, though they are superior in optical characteristic and durability to alkali solution. Zirconium is worse than molybdenum in target density and it is hard to implement dry etching, although it is superior in durability to alkali solution.

Considering these matters, molybdenum is most desirable at this point.

Bonding state of material constructing the light translucent film or the light translucent portion is complex, so it can not be described sweepingly. For example, since SiN, MoSiN, MoN, and the like relates complexly in molybdenum and silicon nitride, and thus, it is not suitable to show with a simple chemical formula. Since component ratio differs to depth direction about ration of component, the state is complex and can not be described.

The light translucent film or the light translucent portion may include a very small quantity or a proper quantity of carbon, hydrogen, fluorine, helium, and the like as a mixture within the range in which function as the light translucent portion is not damaged.

In the invention, for example, molybdenum silicide nitride, tantalum silicide nitride, tungsten silicide nitride, titanium silicide nitride, or material so called compound of one kind or more of these materials and silicon nitride and/or metal nitride is included as material constructing the light translucent film or the light translucent portion.

In the invention, for example, material shown generally up to now such as molybdenum silicide nitride (MoSiN), tantalum silicide nitride (TaSiN), tungsten silicide nitride (WSiN), or titanium silicide nitride (TiSiN), is included as material constructing the light translucent portion.

The light translucent portion has two functions: a shielding function to actually shield exposed light and a phase shift function for shifting phase of light.

Since values of these functions differ depending on an exposure light source at using a mask and wavelength thereof, it needs to design and select the values. The exposure light source mask and wavelength thereof invention are, for example, i line of mercury lamp (wavelength $\lambda$=365 nm), g line of mercury lamp (wavelength $\lambda$=436 nm), KrF excimer laser (wavelength $\lambda$=248 nm), ArF excimer laser (wavelength $\lambda$=193 nm), and F2 excimer laser (wavelength $\lambda$=157 nm).

Phase shift quantity of the light translucent portion is controlled by refraction index (including attenuation coefficient determined depending on film composition constructing the light translucent portion, (nitrogen percentage content (atomic percent), silicon percentage content (atomic percent), and metal percentage content (atomic percent)), and adjusting film thickness.

Placing $\phi$ for phase shift quantity, $\lambda$ for wavelength of exposure light, and n for refraction index, film thickness d of the light translucent portion is determined by the following expression.

$$D=(\phi/360)\times[\lambda/(n-1)] \quad (1)$$

Although phase shift quantity $\phi$ at the expression (1) is most desirable to be 180 degrees from view of improvement of resolution, practically it may be about 160 degrees to 200 degrees.

Light transmittance (shielding performance) to exposure light of the light translucent portion is generally desirable to be about 2 to 20% though sensibility of a resist used at pattern forming of a semiconductor and the like. Since higher transmission is higher phase effect in this range, higher light transmission is desirable. However at line and space, lower transmission is desirable, and at pattern of hole system, higher transmission is desirable.

Light transmission of the light translucent portion is controlled by adjusting mainly nitrogen percentage content (atomic percent), silicon percentage content (atomic percent), and metal percentage content (atomic percent) in film constructing the light translucent portion.

At this time, although it is the absolute condition required for the light translucent portion to satisfy the most proper values for both light transmittance and phase shift quantity φ at the same time in a film of a single layer, this is not always adequate. Composition of the thin film constructing the light translucent portion needs to be determined with consideration of the manufacturing process and the like.

Concretely, for example, a film compound is needed which is durable against acid such as sulfuric acid and the like, used for washing at mask manufacturing process and pre-process of washing at using a mask, or cleaning solvent, and does not generate differences from intended transmission and phase difference by acid washing.

For preventing charge up at mask working and stability at forming film, film component superior in conductivity is needed. In detail, at forming film of phase shift mask blank, transmittance and controllability of film thickness get worse so as to easily generate defect and like in blank as a compound (oxide) is piled up on target surface (particularly non-erosion domain) and discharge becomes unstable. When conductivity of the mask blank is worse, impossibility of drawing or decrease of drawing accuracy and defect generates easily in the mask.

Further, film composition is needed which is comparatively high in refraction index and is thin in film thickness for reversing phase. The reason is that productivity improves by making film thickness thin of course and pattern destruction at washing by mechanical friction and the like (scrubbing washing etc.) can be depressed as stepped height difference of a mask pattern becomes small.

Film composition is needed in which etching selectivity with quartz substrate and the like becomes good. The reason is that etching quantity of the quartz substrate and the like is made the minimum and change of phase shift quantity φ is avoided.

In the invention, from each above-mentioned view point, content (atomic %) and ratio of each component in the thin film is considered in constructing the light translucent portion.

At this time, film composition at the domain (surface layer) of a certain depth from surface of the light transparent portion is important because of it affect on washing and conductivity.

In the invention, percentage content of silicon in the thin film comprising material that includes nitrogen, metal, and silicon as a main component constructing the light translucent film or light translucent portion, is 30 to 60 atomic percent.

Percentage content of silicon has an influence on transmittance mainly.

When percentage content of silicon is less than 30 atomic percent, high transmittance is hard to obtain, and when exceeding 60 atomic percent, etching selectivity with quartz substrate and the like decreases. From this viewpoint, percentage content of silicon is desirable to be 40 to 50 atomic percent.

In the invention, ratio of atomic percent of metal and silicon in thin film comprising material including nitrogen, metal, and silicon as a main component constructing the light translucent film or light translucent portion is desirable to be:

metal:silicon=1:1.5 to 19.0

Ratio of metal and silicon has an influence on acid resistance and light resistance.

When the ratio of metal and silicon is less than 1.5, acid resistance becomes worse, and when it exceeds 19.0, electrical resistance becomes high. From this viewpoint, ratio of metal and silicon is more desirable to be:

metal:silicon=1:2.0 to 12.0

In the invention, percentage content of nitrogen in the thin film comprising material that includes nitrogen, metal, and silicon as a main component constructing the light translucent film or light translucent portion is desirable to be 30 to 60 atomic percent.

Percentage content of nitrogen mainly has an influence on transmittance and etching characteristics, similarly as silicon.

When percent content of nitrogen is less than 30 atomic percent, high transmittance is hard to obtain, and at exceeding 60 atomic percentage, CD control becomes hard because etching rate becomes extremely fast.

In order to obtain a thin film of the above-mentioned composition while ensuring discharge stability at forming film, it is desirable to manufacture a phase shift blank forming a phase shift layer including nitrogen, metal, and silicon by spattering in atmosphere including nitrogen.

The reason is that when silicon content quantity in the target is more than 95 mol percent, spattering voltage cannot be raised very high (hard to let electricity pass) on the surface of the target in DC spattering, so that discharge becomes unstable, and at less than 70 mol percent, a film constructing the light translucent portion of high light transmittance is not obtained.

Discharge stability at forming film affects film quality, and a light translucent portion having good film quality is obtained by superior discharge stability.

Silicon content in spattering target is desirable to be 88 to 95 mol percent for ArF excimer laser. For example, Si:Mo=88:12 to 95:5 is desirable, and neighborhood of Si:Mo=88:12 is more desirable.

When metal, silicon, nitrogen, and oxygen are included in the light translucent film, the total quantity of nitrogen and oxygen is desirable to be 50 to 70 atomic percent. When the total quantity is less than 50 atomic percent, high light transmittance is hard to obtain, and it is considered hard on chemically correct mixture to exceed 70 atomic percent.

Figure 2:
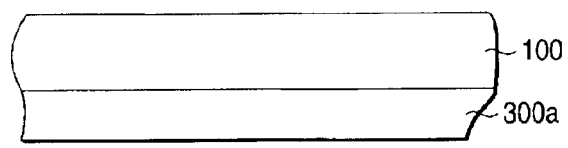
FIG. 2 is a partly sectional view showing a half tone type phase shift mask blank.

In the invention, as shown in FIG. 2, a phase shift mask blank forms a light translucent film 300a having the above-mentioned specific composition on a transparent substrate 100.

The invention includes, for example, a light translucent film of multi layer structure laminating two or more layers of a low transmittance layer and a high transmittance layer other than the light translucent film of single layer comprising nitrogen, metal, and silicon as a main component and not including oxygen as in the first aspect and the light translucent film of single layer including oxygen and/or nitrogen, and silicon as in the second aspect.

In this case, for the high transmittance layer, a material comprising nitrogen, metal, and silicon as a main component and not including oxygen; a material comprising oxygen and/or nitrogen, metal, and silicon; and a material comprising oxygen and/or nitrogen and silicon, can be mentioned as a main component. For low transmittance layer, metal film comprising one kind of or an alloy of two or more of chromium, molybdenum, tantalum, titanium, tungsten and the like, nickel, and palladium, or oxide, nitride, oxide and nitride, silicide, and the like of these metals can be mentioned.

The light translucent film having a two layer structure will be described in detail. At constructing the light translucent portion with film having two or more layers, transmittance is controlled by combination of material having transparency (permeability) in exposure wavelength (high transmittance layer) and material having shielding in exposure wavelength (low transmittance layer).

Here, as optical characteristic of material having transparency used for the high transmittance layer, condition such as the following expression 1 is required. Expression 1 represents that the light translucent portion has a transmittance of at least 3% or more at the exposure wavelength.

$$T \times (1-R) \times \exp(-4\pi k_1 d/\lambda) > 0.03 \quad \text{(expression 1)}$$

Contents of each variable in Expression 1 is as following.

T: transmittance of a transparent substrate at exposure wavelength

R: reflectance of a light translucent portion at exposure wavelength $k_1$: extinction coefficient of material having transparency at exposure wavelength d: film thickness when phase angle at exposure wavelength is 180 degrees d $\lambda/2(n-1)$ $\lambda$: wavelength n: refraction index of the light translucent portion at exposure wavelength Further, as optical characteristic of material having transparency used for the low transmittance layer, condition such as the following expression 2 is required.

$$k_2 > k_1 \quad \text{(Expression 2)}$$

Contents of each variable in Expression 2 is as following.

$k_1$: extinction coefficient of material having transparency at exposure wavelength $k_2$: extinction coefficient of material having shielding at exposure wavelength In the above-mentioned phase shift mask and the manufacturing method thereof, the transparent substrate is not limited to a specific material as long as it is a transparent substrate at exposure wavelength. As the transparent substrate, for example, quartz, fluorite, and another various kinds of glass substrate (for example, sodium lime glass, alminosilicate glass, alminoborosilicate glass, and so on) can be mentioned.

A pattern forming process (patterning and mask working process) is carried out by a series of well-known lithography (photo and electron beam) processes (resist apply, exposure, developing, etching, resist exfoliation, cleansing, and so on), and is not limited to specific methods.

The invention will be described in detail based on embodiments below.

Phase shift mask blank for ArF exima laser (wavelength 193 nm) is obtained forming thin film (film thickness about 670 angstrom) of molybdenum and silicon (MoSiN) nitrided on the transparent substrate by reactive spattering (DC spattering) using mixed target (Mo:Si=8:92 mol %) of molybdenum (Mo) and silicon (Si) with mixed gas atmosphere (Ar:N2=10%:90%, pressure:0.2 Pa) of Argon (Ar) and nitrogen (N2) (embodiments 1, 2, and 3).

Phase shift mask blank for KrF exima laser (wavelength 248 nm) is obtained forming thin film (film thickness about 935 angstrom) of molybdenum and silicon (MoSiN) nitrided on the transparent substrate by reactive spattering (DC spattering) using mixed target (Mo:Si=20:80 mol %) of molybdenum (Mo) and silicon (Si) with mixed gas atmosphere (Ar:N2=10%:90%, pressure:0.2 Pa) of Argon (Ar) and nitrogen N2 (embodiments 4, 5, and 6).

Figure 3:
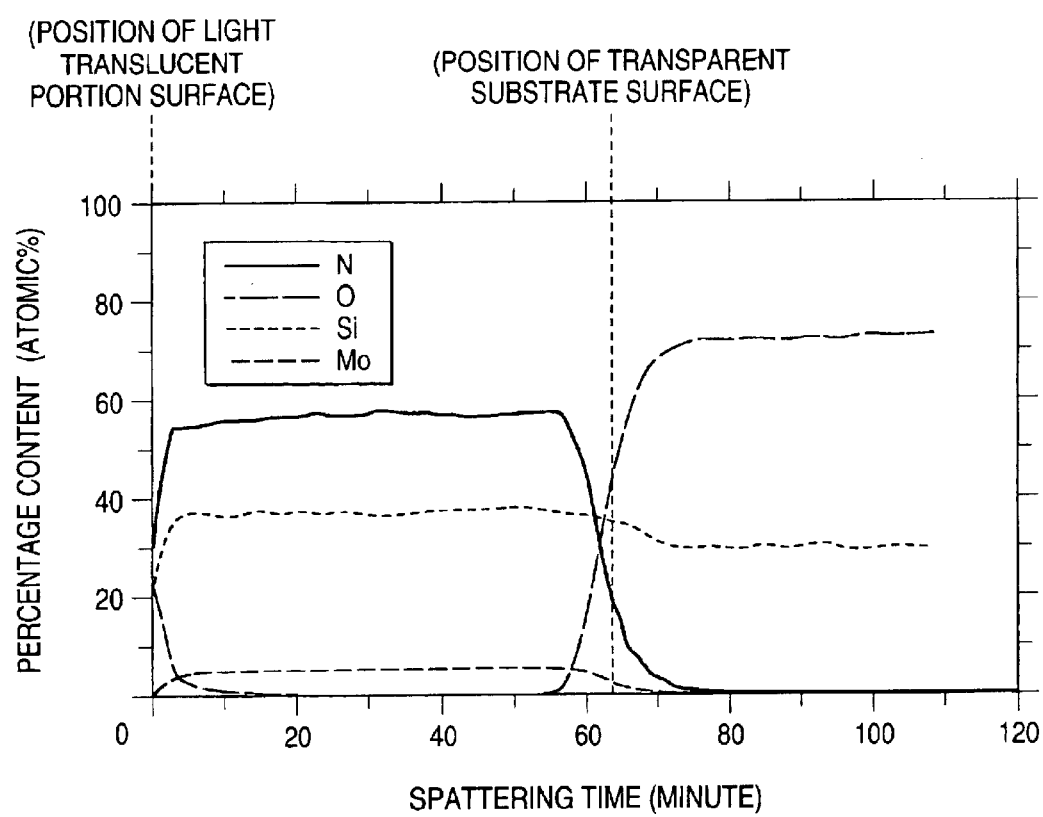
FIG. 3 is a view showing ESCA analysis result of a light translucent film (MoSiN) in Embodiment 1.

ESCA analysis result of the light translucent film obtained in the above-mentioned example 1 is shown in FIG. 3.

From FIG. 3, film composition of the light translucent film (average value over the entire film) is 5.7 atomic percent for Mo, 37.3 atomic percent for Si, and 57.0 atomic percent for N. In the ESCA analysis result, O is detected at quartz substrate side and surface side of the light translucent film. The surface side of the light translucent film is oxidized after forming film, and at the substrate side, O of SiO2 is detected at boundary. At such oxidation, content of nitrogen at the oxidized part decreases relatively. The value of each composition characterized by the invention is considered at main part of film except the surface side and the substrate side at film direction.

Figure 4:
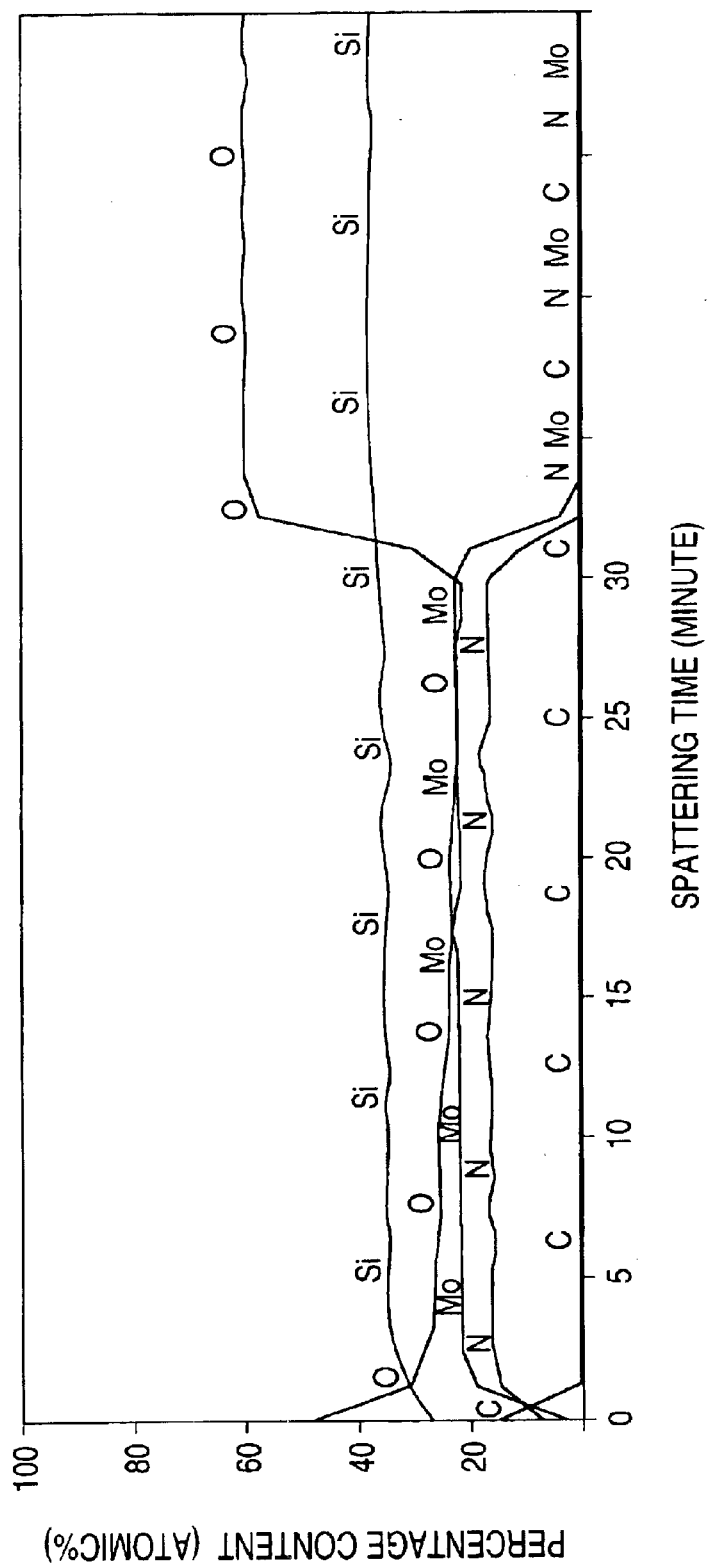
FIG. 4 is a view showing ESCA analysis result of a light translucent film (MoSiON).

For reference, ESCA analysis result of the light translucent film comprising molybdenum and silicon (MoSiON), oxidized and nitrided, is shown in FIG. 4.

The film composition of the light translucent film (average value over the entire film), film thickness, and refraction index obtained at the above-mentioned are shown in Table 1. Exposure wavelength and target composition ratio of the subject are also shown in Table 1.

Film thickness is adjusted so that phase angle at exposure wavelength of the subject becomes about 180 degrees.

For the film thickness measurement of the light translucent film, stage difference is produced by the method implementing masking previously on the substrate before film forming, after that removing the masking, and film thickness of the light translucent film in Table 1 is measured using profile type stage difference thickness (made by Rank Tailor Hobson Inc.:Talystep).

In Table 1, refraction index is obtained from the measured phase angle and film thickness using the following expression (2).

$$N = [(\phi \times \lambda)/360 \times d] + 1 \quad (2)$$

In expression (2), n is average refraction index of the light translucent portion, $\phi$ is phase angle of the light translucent portion, $\lambda$ is the wavelength of exposure light to be used, and d is film thickness of the light translucent portion.

In Embodiments 1, 2, and 3, phase angle is measured using a phase difference meter (made by Laser Tec inc.:MPM-193) because exposure wavelength of the subject is 193 nm.

In Embodiments 4, 5, and 6, phase angle is measured using a phase difference meter (made by Laser Tec inc.:MPM-248) because exposure wavelength of the subject is 248 nm.

Next, thermal treatment is carried out as described below.

About transparent substrate forming the light translucent film as mentioned above, thermal treatment is implemented varying thermal treatment temperature as shown in Table 1.

Figure 5:
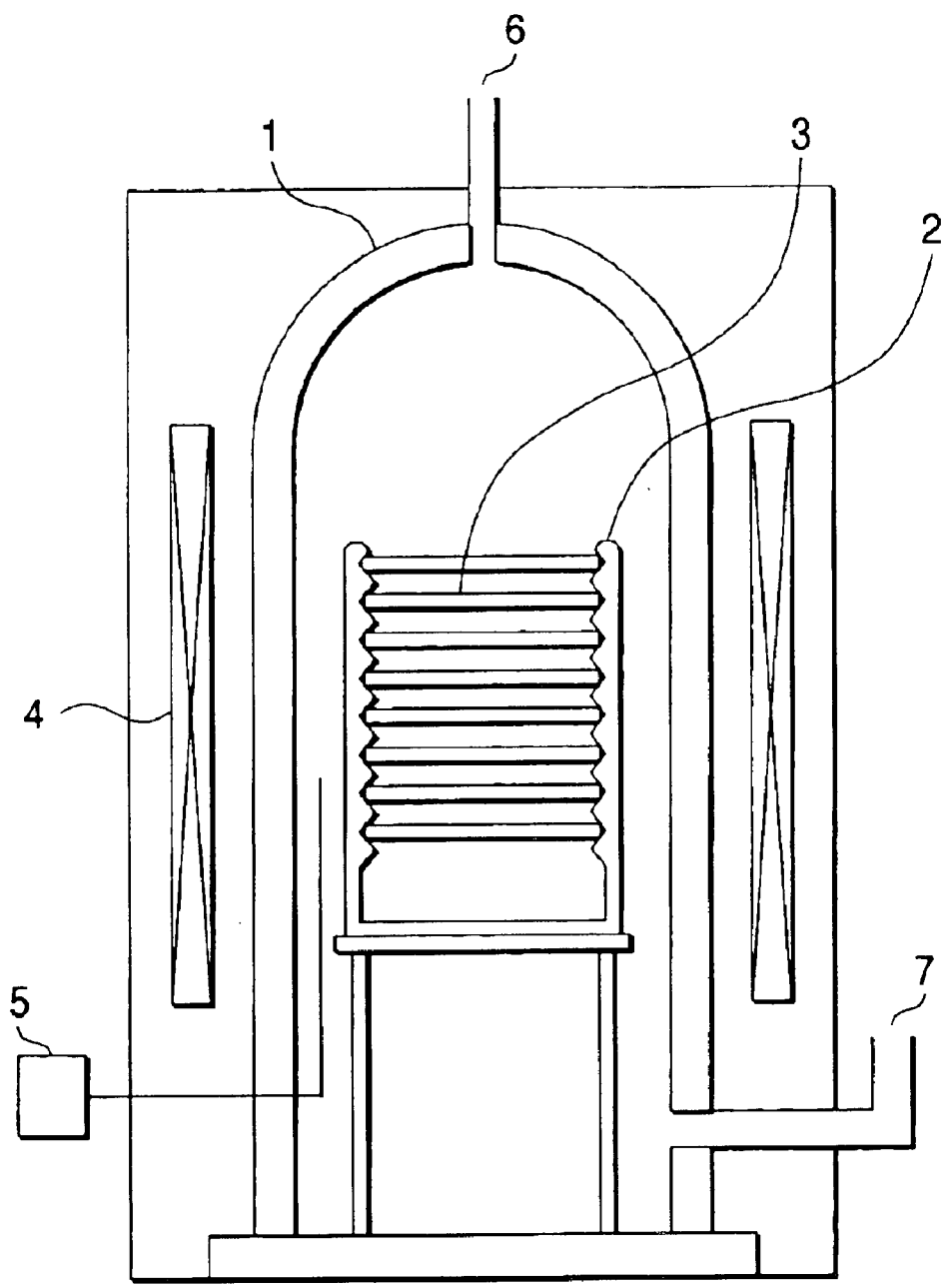
FIG. 5 is a view showing a vertical furnace.

At this time, the thermal treatment is implemented using a vertical furnace as shown in FIG. 5.

The vertical furnace has a quartz tube 1, a quartz boat 2 is formed at an inner portion of the quartz tube 1, and transparent substrates 3 with the light translucent film formed thereon being a treated matter is arranged at the quartz boat 2. The quartz tube 1 is heated by a heater 4 arranged at outer circumference thereof. The transparent substrates 3 with the light translucent film formed thereon are heated by radiating heat from the quartz tube 1. Output of heater 4 is controlled by temperature of a thermocouple 5 arranged in the quartz tube 1.

To the quartz tube 1, inert gas such as nitrogen and the like is led through a gas inlet 6, and the led gas is exhausted out of the quartz tube through an outlet 7. By introducing inert gas such as nitrogen, it is prevented that surface of the light translucent film is oxidized. Particularly, when thermal treatment of more than 400° C. is implemented and in the case where gas displacement in the quartz tube is not implemented (thermal treatment in air), surface of the light translucent film is oxidized, and phase angle decreases comparing before thermal treatment.

By letting the gas circulate in the quartz tube, heat of the quartz tube 1 is conducted efficiently to the transparent substrate 3 forming the light translucent film, and effect to make temperature in the tube uniform is obtained.

Transmittance, chemical resistance, and internal stress, before and after thermal treatment, are shown in Table 2.

Transmittance of the light translucent film is measured using spectrophotometer (made by Hitachi Inc.:U-4000) making air 100% as standard.

Acid resistance of the light translucent film is valued with phase change of before and after dipping 120 minutes in heat concentrated sulphuric acid ($H_2SO_4$:96%, temperature: 100° C.). Negative value shows that phase angle decreased.

Alkali resistance of the light translucent film is evaluated with phase change of before and after dipping 120 minutes in ammonia water (29%$NH_3$:30%$H_2O_2$:$H_2O$=1:2:10 (volume ratio), temperature: 25° C.). Negative value shows that phase angle decreased.

Magnitude of internal stress of the light translucent film is evaluated with flatness change of the transparent substrate at before and after of forming the light translucent film. For the transparent substrate, synthetic quartz: a square, the length of the side is 152 mm, thickness is 6.35 mm, is used.

Flatness of the substrate is measured at range of 146 mm square excluding 3 mm of edge of the substrate, and is defined with difference of height at the highest point and the lowest point from average face of the substrate. Flatness of the substrate is measured using an interferometer (TROPEL Inc.: Flat Master 200). Since the light translucent film in the invention has compressed stress frequently, forming face of the light translucent film is deformed to convex side. In order to measure accurately internal stress of the film in such the case, it is desirable to measure flatness of before and after forming the light translucent film using the transparent substrate in which face of the light translucent film is convex shape. Positive value of change of flatness shows compression of internal stress of the film.

TABLE 1

| | Exposure Wavelength | Target composition (mol %) | | Film composition (atomic %) | | | Film thickness | Refraction index | Thermal treatment temp. |
|---|---|---|---|---|---|---|---|---|---|
| | (nm) | Mo | Si | Mo | Si | N | (angstrom) | | (° C.) |
| Embodiment 1 | 193 | 8 | 92 | 6 | 37 | 57 | 672 | 2.44 | 200 |
| Embodiment 2 | 193 | 8 | 92 | 6 | 37 | 57 | 674 | 2.43 | 400 |
| Embodiment 3 | 193 | 8 | 92 | 6 | 37 | 57 | 678 | 2.40 | 600 |
| Embodiment 4 | 248 | 20 | 80 | 13 | 40 | 47 | 932 | 2.33 | 200 |
| Embodiment 5 | 248 | 20 | 80 | 13 | 40 | 47 | 935 | 2.33 | 400 |
| Embodiment 6 | 248 | 20 | 80 | 13 | 40 | 47 | 941 | 2.30 | 600 |

TABLE 2

| | Before thermal treatment | | | | After thermal treatment | | | |
|---|---|---|---|---|---|---|---|---|
| | Transmittance (%) | Acid Resist (°) | Alkali Resist (°) | Flatness change (μm) | Transmittance (%) | Acid resist (°) | Alkali resist (°) | Flatness change (μm) |
| Embodiment 1 | 5.5 | −0.7 | −3.8 | +0.9 | 5.8 | −0.7 | −3.7 | +0.7 |
| Embodiment 2 | 5.5 | −0.7 | −3.8 | +0.9 | 6.3 | −0.5 | −3.2 | +0.5 |
| Embodiment 3 | 5.5 | −0.7 | −3.8 | +0.9 | 7.0 | −0.3 | −2.5 | +0.2 |
| Embodiment 4 | 5.5 | −2.0 | −15.3 | +0.7 | 5.8 | −1.8 | −15.0 | +0.6 |
| Embodiment 5 | 5.5 | −2.0 | −15.3 | +0.7 | 6.3 | −1.3 | −11.0 | +0.4 |
| Embodiment 6 | 5.5 | −2.0 | −15.3 | +0.7 | 7.3 | −0.5 | −6.3 | +0.1 |

As clear from Table 1 and Table 2, in the case where thermal treatment is implemented as the invention (after thermal treatment), acid resistance and alkali resistance improve and internal stress decreases compared with the conventional case where the thermal treatment is not implemented (before thermal treatment). It is known that this tendency becomes large as temperature of the thermal treatment becomes high.

Mask working will be explained now.

A resist film is formed on thin film comprising nitrided molybdenum and silicon (MoSiN) of the above-mentioned shift mask blank, and a resist pattern is formed by pattern exposure and developing. Next, an exposed portion of thin film comprising nitrided molybdenum and silicon is removed, and a pattern (hole, dot, and so on) of thin film comprising nitrided molybdenum and silicon is obtained. After resist exfoliation, a phase shift mask for ArF excimer laser and a phase shift mask for KrF exima mask are obtained by dipping in 98% sulfuric acid ($H_2SO_4$) of 100° C. 15 minutes cylindrical crystal, washing sulfuric acid, and rinsing with pure water and the like.

As the result, good pattern sectional shape is obtained, and side wall of the pattern is smooth.

Embodiments 7 and 8 and a comparison example will be explained.

A phase shift mask blank for ArF exima laser (wavelength 193 nm) of film composition Mo:Si:O:N=5:30:39:26 is obtained forming a thin film (film thickness about 880 angstrom) of molybdenum and silicon (MoSiON) nitrided on the transparent substrate by reactive spattering (DC spattering) using mixed target (Mo:Si=8:92 mol %) of molybdenum (Mo) and silicon (Si) with mixed gas atmosphere (Ar:N2:O2=20%:50%:30, pressure:0.1 Pa) of Argon (Ar), nitrogen (N2), and oxygen (O2).

Upon transparent substrate forming the light translucent film as mentioned above, thermal treatment is carried out varying thermal treatment temperature as shown in Table 3 by a similar method with Embodiments 1 to 6.

Transmittance and flatness change quantity at before and after thermal treatment are shown in Table 3.

TABLE 3

| | Thermal treatment temp. (° C.) | Transmittance (%) | Flatness change of before thermal treatment ($\mu$m) | Flatness change of after thermal treatment ($\mu$m) |
|---|---|---|---|---|
| Comparing ex 1 | 200 | 14.5 | +0.8 | +0.6 |
| Embodiment 7 | 400 | 16.5 | +0.8 | +0.4 |
| Embodiment 8 | 600 | 20.1 | +0.8 | +0.1 |

Although the light translucent film is constructed with a film of single layer in the above-mentioned Embodiments 1 to 8. By using the invention even in the light translucent film constructed with film of two or more layers including thin film of at least one layer comprising oxygen and/or nitrogen, and silicon as a main component, it is possible to obtain a phase shift mask blank which has a light translucent film superior in film characteristics such as chemical resistance, light resistance to exposure light, and internal stress.

Embodiment 9 and comparing example 2 will be explained.

A thin film (film thickness about 80 angstrom) of molybdenum and silicon (MoSi) is formed as a first layer on the transparent substrate by reactive spattering (DC spattering) using mixed target (Mo:Si=8:92 mol %) of molybdenum (Mo) and silicon (Si) with argon (Ar) gas atmosphere (pressure:0.1 Pa). Consecutively, a thin film (film thickness about 860 angstrom) of oxidized and nitrided silicon (SiON) is formed as a second layer by reactive spattering (DC spattering) using a target of silicon (Si) with mixed gas atmosphere (Ar:N2:O2=10%:60%:30, pressure:0.1 Pa) of argon (Ar), nitrogen (N2), and oxygen (O2).

The film composition of the second layer in Embodiments 9 and 10 is Si:O:N=32:53:15 atomic percent, at combination with MoSi thin film of the first layer, the film composition is adjusted so as to have the most suitable optical characteristic as a phase shift mask blank for F2 excimer laser (wavelength 157 nm)

Upon the transparent substrate with the light translucent film formed as mentioned above, thermal treatment is carried out varying thermal treatment temperature as shown in Table 4 by a similar method with Embodiments 1 to 8.

Refraction index and flatness change quantity at before and after thermal treatment are shown in Table 4.

TABLE 4

| | Thermal Treatment temp. (° C.) | Transmittance (%) | Flatness change of before thermal treatment ($\mu$m) | Flatness change of after thermal treatment ($\mu$m) |
|---|---|---|---|---|
| Comparing ex 2 | 200 | 9.3 | +0.9 | +0.7 |
| Embodiment 9 | 400 | 10.1 | +0.9 | +0.3 |
| Embodiment 10 | 600 | 12.7 | +0.9 | −0.1 |

Although the invention is described above referring preferred embodiments, the invention is not limited to the above-mentioned embodiments.

For example, the light translucent film may be formed by RF spattering instead of DC spattering. In RF spattering, particles getting mixed in the light translucent film from inner wall of neighbor part of the target increase in number so that defects increase in number comparing with the DC spattering because plasma space near the target is large comparing DC spattering. By the result, DC spattering is desirable.

The light translucent film may be formed by a spattering using a target including silicon and nitrogen instead of reactive spattering. In the reactive spattering, high density target can be used and discharge is comparatively stable, so that particles are few.

Another inert gas such as helium, neon, xenon, and the like may be used instead of Ar gas in the embodiments.

Further, metal such as Ta, W, Ti, Cr, and the like may be used instead of Mo in the embodiments.

As described above, according to the invention, a method for manufacturing a phase shift mask blank or a method for manufacturing a phase shift mask is provided, which has the designated phase angle and transmittance and has a light translucent film or a light translucent portion superior in film characteristics such as chemical resistance, light resistance, and internal stress.

What is claimed is:

1. A method for manufacturing a half tone phase shift mask blank having a translucent film on a transparent substrate,
    wherein thermal treatment of the translucent film is implemented at no less than 150° C. after forming the translucent film including at least one layer of thin film comprising nitrogen, metal, and silicon as main components on said transparent substrate.

2. A method for manufacturing a half tone phase shift mask blank according to claim 1,
    wherein percentage content of silicon being a component of said translucent film is 30 to 60 atomic percent.

3. A method for manufacturing a half tone phase shift mask blank according to claim 1,
    wherein ratio of atomic percent of metal and silicon being components of said translucent film satisfies the following:
    metal:silicon=1:1.5 to 19.0.

4. A method for manufacturing a half tone phase shift mask blank according to claim 1,
    wherein said metal is one kind or two or more kinds of metals selected from molybdenum, zirconium, titanium, vanadium, niobium, tantalum, tungsten, nickel, and palladium.

5. A mask blank manufactured by the method for manufacturing according to claim 1.

6. A mask manufactured by patterning the thin film in the mask blank according to claim 5.

7. A pattern transcription method transcribing a pattern using the mask according to claim 6.

8. A method for manufacturing a half tone phase shift mask blank having a translucent film on a transparent substrate, wherein thermal treatment of the translucent film is implemented at more than 380° C. after forming the translucent film including at least one layer of thin film including oxygen and/or nitrogen, and silicon on said transparent substrate.

9. A method for manufacturing a half tone phase shift mask blank according to claim 8, wherein said thin film including oxygen and/or nitrogen, and silicon includes metal.

10. A method for manufacturing a half tone phase shift mask blank according to claim 8, wherein said metal is one kind or two or more kinds of metals selected from molybdenum, zirconium, titanium, vanadium, niobium, tantalum, tungsten, nickel, and palladium.

11. A mask blank manufactured by the method for manufacturing according to claim 8.

12. A method for manufacturing a photo mask having thin film of one layer or multi layers for forming a pattern on a transparent substrate, wherein thermal treatment is implemented so that flatness change quantity at before and after film forming of thin film having said one layer or multi layers is less than 0.5 $\mu$m after forming thin film of one layer or multi layers including at least one layer of thin film having compression stress on said transparent substrate.

13. A mask blank manufactured by the method for manufacturing according to claim 12.

14. A method for manufacturing a half tone phase shift mask having a pattern of a light translucent film patterned on a transparent substrate, wherein thermal treatment of the pattern of the translucent film is implemented at more than 150° C. after forming the pattern of the translucent film.

15. A half tone phase shift mask manufactured using the method for manufacturing according to claim 14.

16. A pattern transcription method transcribing a pattern using the mask according to claim 15.

17. A method for manufacturing a photo mask blank having thin film of one layer or multi-layers for forming a pattern on a transparent substrate, said method comprising the steps of:

forming a translucent thin film of one layer or multi-layers including at least one layer of thin film having compression stress on said transparent substrate, and implementing a thermal treatment onto said translucent thin film so that compression of internal stress becomes lowered by not less than 0.3 $\mu$m in flatness change quantity that is compared to flatness change quantity before implementing said thermal treatment.

18. A method for manufacturing a photo mask blank according to claim 17, wherein said translucent thin film includes at least nitrogen and silicon.

* * * * *